United States Patent
Ku

(10) Patent No.: US 9,078,339 B2
(45) Date of Patent: Jul. 7, 2015

(54) DISPLAY DEVICE, ASSEMBLY METHOD OF A DISPLAY DEVICE AND ASSEMBLY STRUCTURE FOR USE IN A DISPLAY

(71) Applicant: DELTA ELECTRONICS, INC., Taoyuan Hsien (TW)

(72) Inventor: Tsang-Hsing Ku, Taoyuan Hsien (TW)

(73) Assignee: DELTA ELECTRONICS, INC., Taoyuan Hsien (TW)

( * ) Notice: Subject to any disclaimer, the term of this patent is extended or adjusted under 35 U.S.C. 154(b) by 319 days.

(21) Appl. No.: 13/732,781

(22) Filed: Jan. 2, 2013

(65) Prior Publication Data
US 2014/0016249 A1    Jan. 16, 2014

(30) Foreign Application Priority Data
Jul. 13, 2012 (TW) .............................. 101125224 A

(51) Int. Cl.
| | |
|---|---|
| H05K 7/00 | (2006.01) |
| H05K 5/00 | (2006.01) |
| H05K 13/00 | (2006.01) |
| H05K 5/02 | (2006.01) |

(52) U.S. Cl.
CPC ............ *H05K 5/0004* (2013.01); *H05K 5/0008* (2013.01); *H05K 13/00* (2013.01); *Y10T 29/49826* (2015.01); *H05K 5/0234* (2013.01)

(58) Field of Classification Search
CPC ............................... F16B 37/047; F16B 21/02
USPC ............ 361/679.01, 679.02, 679.08, 679.09, 361/679.3, 679.55–679.59; 455/325, 556.1, 455/550.1, 90.1, 575.1; 411/107, 353, 418, 411/999

See application file for complete search history.

(56) References Cited

U.S. PATENT DOCUMENTS

| | | | |
|---|---|---|---|
| 6,715,890 B2 | 4/2004 | Huang et al. | |
| 7,533,857 B2 | 5/2009 | Chung et al. | |
| 7,851,741 B2 | 12/2010 | Tseng | |
| 2001/0035442 A1* | 11/2001 | Yokobori | ...................... 224/197 |

FOREIGN PATENT DOCUMENTS

| | | |
|---|---|---|
| CN | 1477442 | 2/2004 |
| CN | 102193282 | 8/2012 |
| TW | M273743 | 8/2005 |
| TW | I247187 | 1/2006 |
| TW | M327047 | 2/2008 |
| TW | I359326 | 3/2012 |

* cited by examiner

*Primary Examiner* — Jerry Wu
(74) *Attorney, Agent, or Firm* — Grossman, Tucker, Perreault & Pfleger, PLLC

(57) ABSTRACT

A display device is provided. The display device has an upper case, a lower case, at least one fastening unit and at least one adjustable module. The upper case and the lower case respectively have at least one first fasten hole and at least one second fasten hole. The second fasten hole coaxially communicates with the first fasten hole. Through the second fasten hole, the unit is fixed in the first fasten hole to fasten the upper case and the lower case together. The adjustable module has an adjustable unit with a through hole penetrating therethrough. Furthermore, the adjustable unit is partially disposed in the second fasten hole. By disposing the adjustable unit and the fastening unit within the second fasten hole, the display device could be made more compact and the overall cost can be decreased.

14 Claims, 9 Drawing Sheets

DISPLAY DEVICE, ASSEMBLY METHOD OF A DISPLAY DEVICE AND ASSEMBLY STRUCTURE FOR USE IN A DISPLAY

CROSS-REFERENCES TO RELATED APPLICATIONS

This application claims priority to Taiwan Patent Application No. 101125224 filed on Jul. 13, 2012, which are hereby incorporated herein by reference in its entirety.

BACKGROUND OF THE INVENTION

1. Field of the Invention

The present invention provides a display device, and more particularly, to a display device which features a low cost and simple structure that can also be miniaturized.

2. Descriptions of the Related Art

With the development and widespread use of display devices (e.g., projection devices), display devices are designed to be more miniaturized to satisfy users' demands. Moreover, the miniaturization of display devices further promotes the possibility of portability of the display devices. In addition, miniaturized and portable display devices are capable of operating without being fixedly disposed on a wall or disposed with the aid of a particular support. Therefore, designs should consider the fact that display devices need to operate in different environments. For example, most of the display devices are provided with an auxiliary structure capable of adjusting the display angle thereof to improve the display quality and the projection quality of the display devices.

FIGS. 1A and 1B show schematic views of a display device 1 and a height adjusting device 12 thereof disclosed in Taiwan Utility Module No. M327047. The display device 1 has a body and the height adjusting device 12. The body comprises a housing 10. The height adjusting device 12 further comprises a joining unit 120, a rotary disk 121 and a screw bolt 122. The joining unit 120 connects the height adjusting device 12 with the body. The rotary disk 121 is movably engaged with the joining unit 120 and is rotatable with respect to the joining unit 120. At the center of the rotary disk 121 is a screw hole in which the screw bolt 122 is screwed. When the rotary disk 121 is rotated about the screw bolt 122, an upward and downward linear motion can be carried out in an axial direction of the screw bolt to adjust the height of the display device 1.

In other words, for the abovementioned display device 1 and common conventional display devices, a particular space or region usually must be reserved in the body during the design to receive the height adjusting device 12. Moreover, the space or region occupied by the height adjusting device 12 in the display device is fixed, and this will limit the extent to which the overall display device is miniaturized (only structures other than the height adjusting device 12 can be adjusted and reduced). Furthermore, a common display device is often provided with at least two height adjusting devices to adjust the projection angle more precisely, and this further exacerbates the aforesaid shortcoming (i.e., there are multiple fixed spaces or regions.)

Therefore, apart from making it difficult to effectively reduce the volume of the body of the display device, the method of designing the height adjusting device 12 and the body separately and then assembling the height adjusting device 12 and the body together can further cause difficulty and complexity in the disassembly and maintenance of the body of the display device in the future.

Accordingly, it is important to design a display device that features a simpler and more compact structure, a lower cost and a miniaturized volume.

SUMMARY OF THE INVENTION

An objective of the present invention is to provide a display device that can mount an adjustable module with cases together.

Another objective of the present invention is to provide an assembly structure for use in a display device.

A further objective of the present invention is to provide a display device that can be miniaturized.

Yet another objective of the present invention is to provide a display device that has a lower cost.

To achieve the aforesaid objectives, the present invention provides a display device, which at least comprises an upper case, a lower case, at least one fastening unit and at least one adjustable module. The upper case comprises at least one first fasten hole. The lower case comprises at least one second fasten hole, which coaxially communicates with the at least one first fasten hole. The at least one fastening unit is fixed in the at least one first fasten hole through the at least one second fasten hole to fasten the upper case and the lower case together. The at least one adjustable module comprises an adjustable unit with a through hole penetrating therethrough. The adjustable unit has a first portion and a second portion, the first portion is exposed outside the lower case, and the second portion is at least partially mounted inside the at least one second fasten hole.

The present invention further provides an assembling method of a display device. The display device is the display device as described above. First, the at least one first fasten hole of the upper case is aligned with the at least one second fasten hole of the lower case. Then, the at least one fastening unit is fastened through the at least one second fasten hole into the at least one first fasten hole to fasten the upper case and the lower case together. Finally, the adjustable module is mounted within the second fasten hole of the lower case.

The present invention further provides an assembly structure for use in a display device. The display device comprises an upper case and a lower case, and the lower case is assembled opposite to the upper case. The assembly structure comprises a first fasten hole, a second fasten hole, a fastening unit and an adjustable module. The first fasten hole is disposed in the upper case. The second fasten hole is disposed in the lower case and coaxially communicates with the first fasten hole. The fastening unit is fixed in the first fasten hole through the second fasten hole to fasten the upper case and the lower case together. The adjustable module comprises an adjustable unit with a through hole penetrating therethrough. The adjustable unit has a first portion and a second portion. In detail, the first portion is exposed outside the lower case, while the second portion is at least partially mounted inside the second fasten hole.

In brief, the adjustable module and the fastening unit of the display device share the same fasten holes (the first and the second fasten holes), therefore the present invention can make effective use of the internal space of the display device and miniaturize the display device.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following descriptions, the present invention will be explained with reference to embodiments thereof. The present invention provides a display device. It shall be appreciated that, in the following embodiments and the attached drawings, the description of these embodiments are only for the purpose of illustration rather than to limit the present invention. Meanwhile, in the following embodiments and attached drawings, elements (e.g., internal display modules, optical elements of the display device) that are not directly related to the present invention are omitted from depiction; and the dimensional relationships among and the numbers of individual elements in the attached drawings are illustrated only for ease of understanding but not to limit the actual scale, actual size and actual numbers.

Figure 1A:
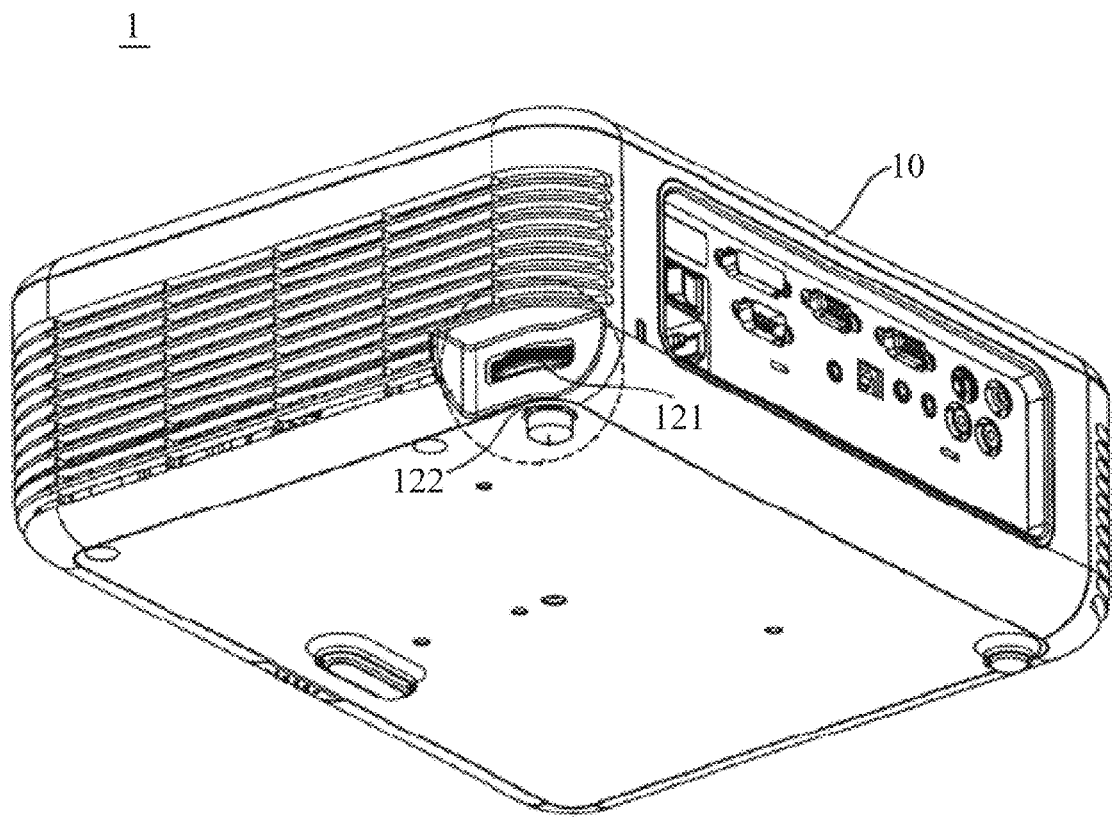
FIG. 1A is a schematic view illustrating a display device disclosed in Taiwan Utility Module No. M327047.
Figure 1B:
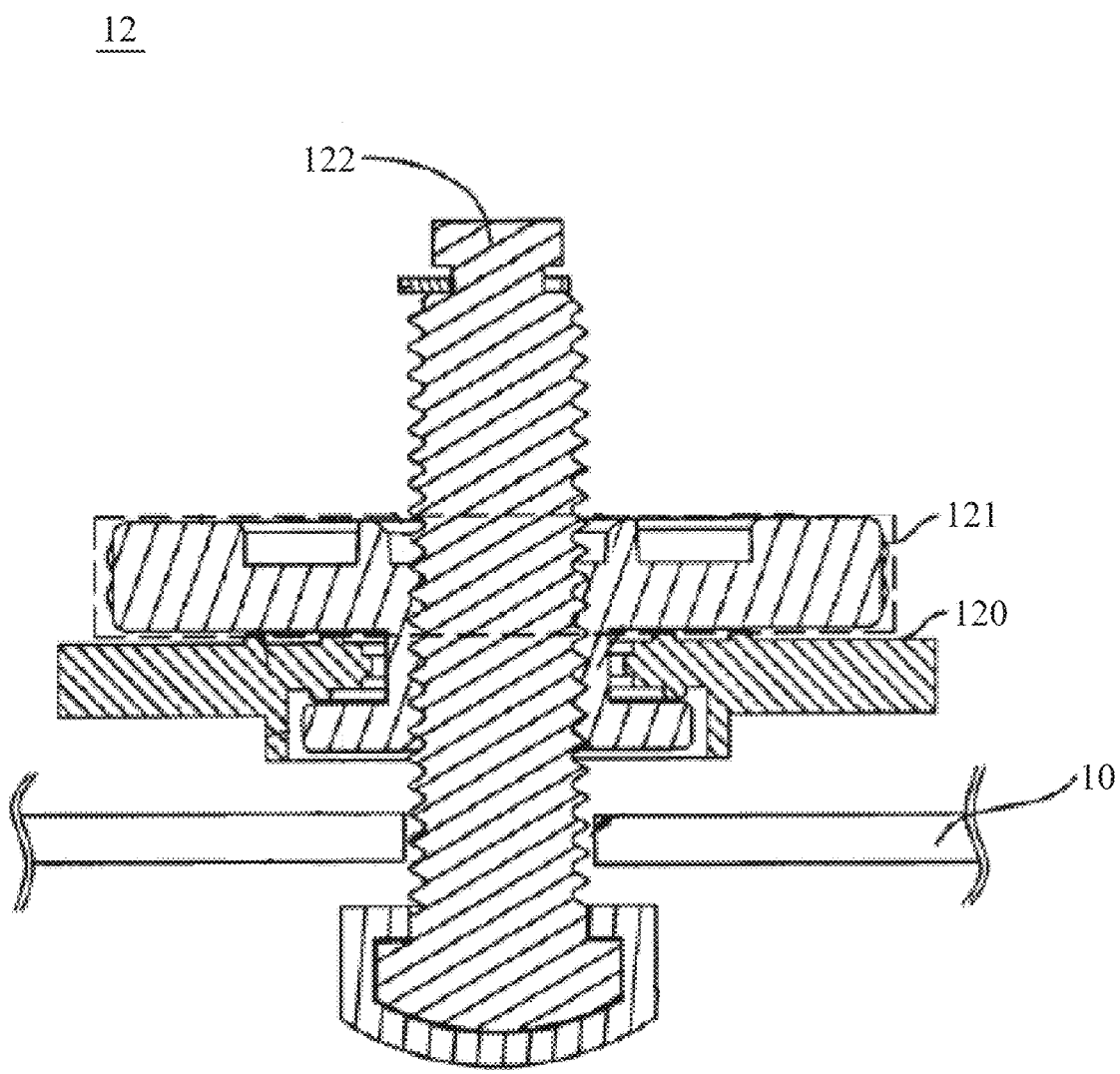
FIG. 1B is a schematic view illustrating the height adjusting device of the display device shown in FIG. 1A.
Figure 2A:
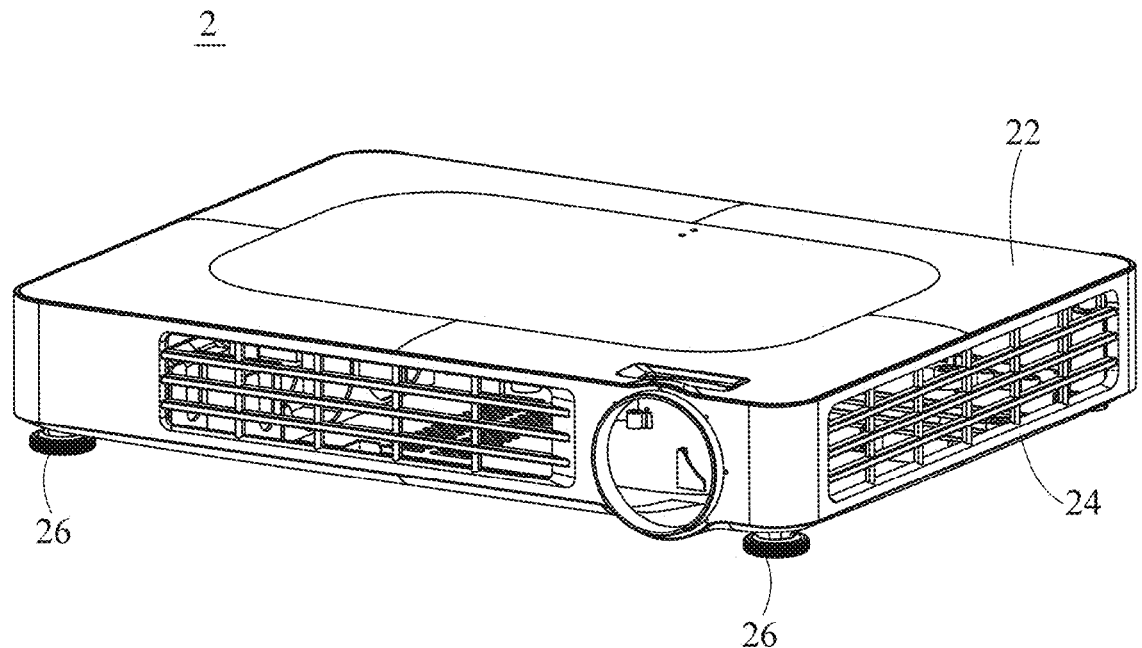
FIG. 2A is a schematic view illustrating the first embodiment of a display device of the present invention.
Figure 2B:
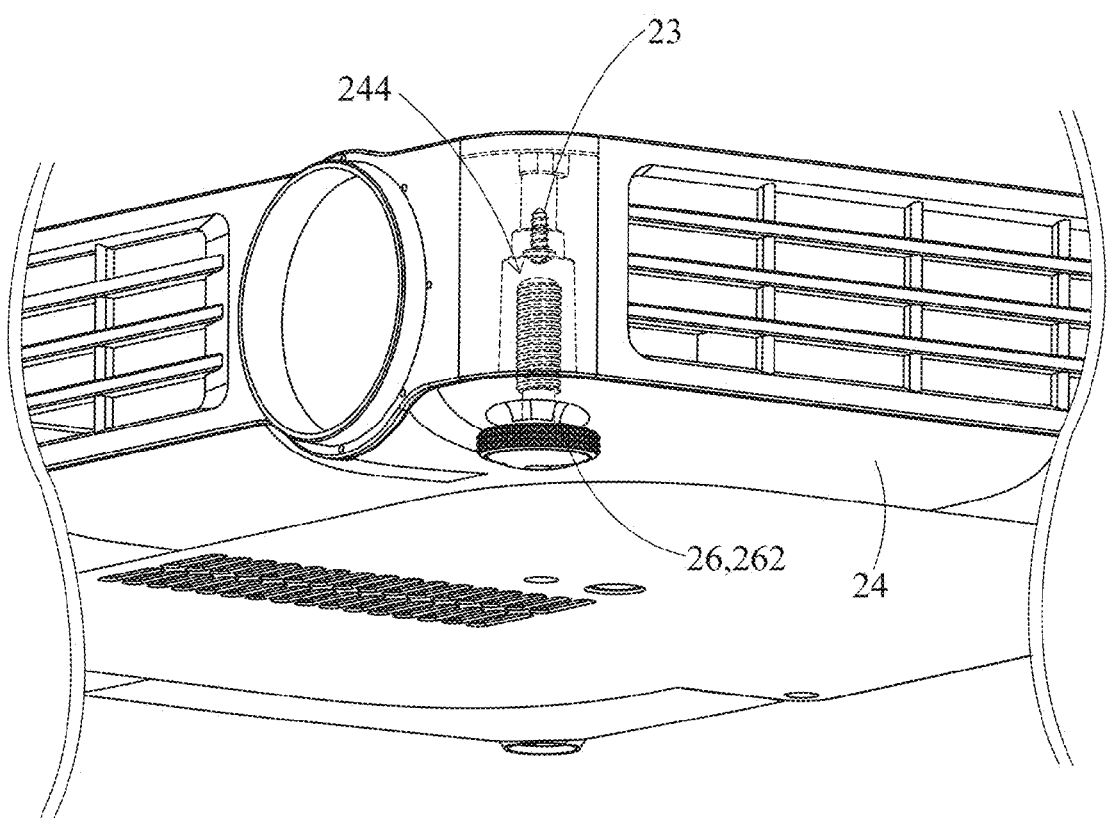
FIG. 2B is a schematic partially enlarged view of the display device shown in FIG. 2A.
Figure 2C:
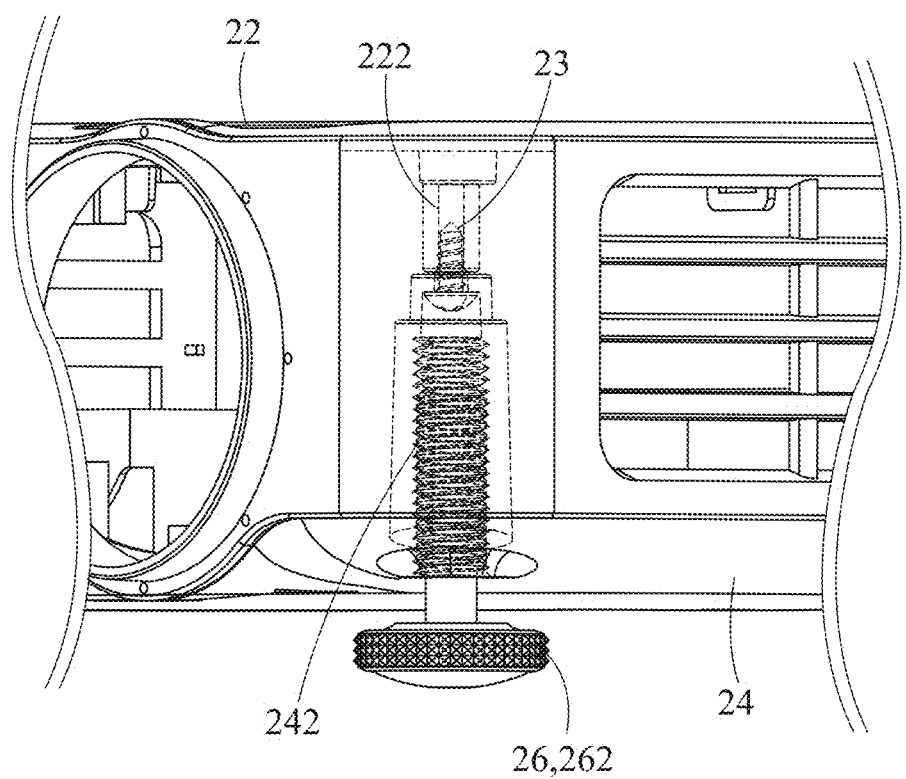
FIG. 2C is another schematic partially enlarged view of the display device shown in FIG. 2A.

FIGS. 2A to 2C, illustrate a schematic view of the first embodiment of a display device of the present invention, a schematic partially enlarged view of the display device and another schematic partially enlarged view of the display device are shown therein respectively. FIGS. 2B and 2C are schematic partially enlarged views depicted at different view angles.

The display device 2 at least comprises an upper case 22, a lower case 24, at least one fastening unit 23 and at least one adjustable module 26. The upper case 22 comprises at least one first fasten hole 222. The lower case 24 comprises at least one second fasten hole 242, which coaxially communicates with the first fasten hole 222. The first fasten hole 222 and second fasten hole 242 are respectively disposed at any one of the right-angle corners, which correspond to each other, of the upper case 22 and the lower case 24.

The display device 2 of this embodiment is a projection device. The two fastening units 23, two first fasten holes 222, two second fasten holes 242 and two adjustable modules 26 are illustrated as an example in this embodiment; however, the present invention is not limited thereto. The upper case 22 and the lower case 24 of this embodiment are rectangle cases, while the two first fasten holes 222 and the two second fasten holes 242 are disposed at two right-angle corners of the rectangle cases that are close to a lens (not shown).

Furthermore, the second fasten holes 242 of the lower case 24 coaxially communicate with and are disposed opposite to the first fasten holes 222 of the upper case 22. The fastening units 23 are fixed in the first fasten holes 222 through the second fasten holes 242 to fasten the upper case 22 and the lower case 24 together. The fastening units 23 of this embodiment are screws, while the first fasten holes 222 and the second fasten holes 242 may be formed with screw threads on the inner sides thereof so that the fastening units 23 could fasten the upper case 22 and the lower case 24 together.

Additionally, each of the adjustable modules 26 of the present invention has an adjustable unit 262 and a through hole (not shown, but reference may be made to FIG. 3) penetrating through the adjustable unit 262. The adjustable units 262 are at least partially fixed within the second fasten holes 242. In this embodiment, the adjustable units 262 are screw bolts. The adjustable units 262 and the fastening units 23 define a receiving space 244 (FIG. 2B) within the second fasten holes 242 respectively. Users can change the inclination angle of the display device 2 by adjusting and changing the depth at which the adjustable units 262 is disposed in the second fasten holes 242. The function and the purpose of the receiving space 244 will be described later.

In brief, the present invention has the adjustable units 262 of the adjustable modules 26 and the fastening units 23 of the display device 2 share the same fasten holes (the first fasten holes 222 and the second fasten holes 242). This is advantageous in that the total number of the holes of the display device 2 can be decreased to effectively reduce the manufacturing cost and simplify the design. Moreover, using the same fasten holes can further make effective use of the internal space of the display device 2.

It shall be appreciated that the fastening units 23 are used in cooperation with the first fasten holes 222 and the second fasten holes 242, so the number of the fastening units 23 of the present invention shall be equal to that of the first fasten holes 222 and the second fasten holes 242. Although the adjustable units 262 of the adjustable modules 26 need also be used in cooperation with (i.e., be partially mounted inside) the second fasten holes 242, the number of the adjustable units 262 of the adjustable modules 26 is unnecessarily identical to that of the second fasten holes 242 (i.e., not each of the second fasten holes 242 must have an adjustable unit 262 disposed therein).

The first fasten holes 222, the second fasten holes 242, the fastening units 23 and the adjustable modules 26 of the present invention may be defined as an assembly structure.

Figure 3:
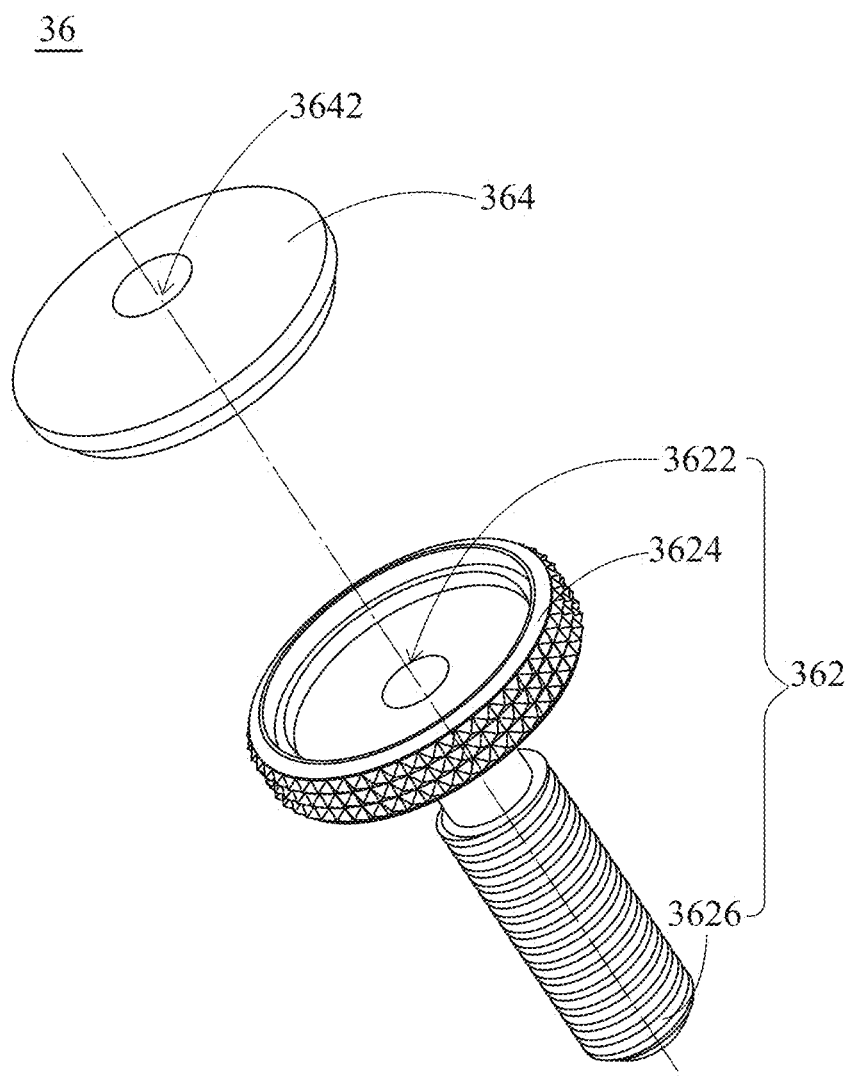
FIG. 3 is an exploded view illustrating the adjustable unit of the display device of the present invention.
Figure 4:
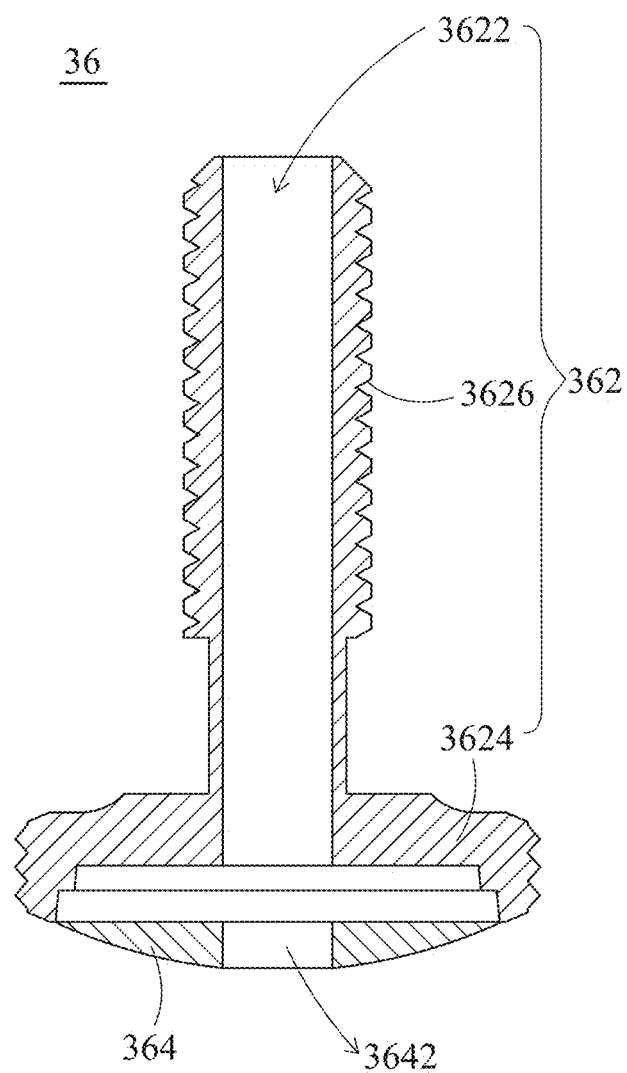
FIG. 4 is a schematic cross-sectional view illustrating the adjustable unit of the display device of the present invention.

Next, with reference to FIGS. 3 and 4, an exploded view illustrating an adjustable unit of the display device of the present invention and a schematic cross-sectional view of the adjustable unit are shown therein respectively.

The adjustable module 36 of the present invention has an adjustable unit 362 and a through hole 3622 penetrating through the adjustable unit. The adjustable unit 362 has a first portion 3624 and a second portion 3626. The first portion 3624 is exposed outside the lower case (see FIG. 2A to FIG. 2C), and the second portion 3626 is at least partially mounted inside the second fasten hole (also see FIG. 2A to FIG. 2C). The adjustable unit 362 of this embodiment is a screw bolt but is not limited thereto, and any equivalent members that can be partially fixed in the second fasten hole and can achieve the adjusting function are all possible.

In detail, the first portion 3624 of the adjustable unit 362 of this embodiment is a screw nut, while the second portion 3626 is a screw bolt (in this embodiment, the first portion 3624 and the second portion 3626 are integrally formed, but the present invention is not limited thereto). Moreover, the through hole 3622 extends through the first portion 3624 and the second portion 3626 (along an axis of the screw nut and the screw bolt), and the second portion 3626 of the adjustable unit 362 is partially fixed and mounted inside in the second fasten hole (see FIG. 2A to FIG. 2C) of the lower case of the display device. The inclination angle of the display device (see FIG. 2A to FIG. 2C) can be changed by adjusting and changing the depth at which the second portion 3626 is fixed in the second fasten hole.

The terms "adjusting and changing" described herein refer to moving the screw bolt upwards and downwards linearly along the screw threads of an inner wall of the second fasten hole by rotating the screw nut. However, those of ordinary skill in the art may also replace the screw bolt with other equivalent implementations (e.g., with stepped tooth-like screw threads), which can also achieve an effect similar to that of this embodiment.

It shall be particularly appreciated that the through hole 3622 of the adjustable unit 362 of the present invention and the fastening unit in the display device that fastens the upper case and the lower case together define a receiving space (reference may be made to the receiving space 244 of FIG. 2B). Therefore, when the display device is to be maintained, the fastening unit can be disassembled directly by inserting a maintenance instrument (e.g., a screwdriver) through the through hole 3622 (reference may be made to FIG. 2B or 2C), and the fastening unit is left in the receiving space. This arrangement is advantageous in that the upper case and the lower case can be separated without removing the adjustable module 36 and, furthermore, leaving the fastening unit in the receiving space can further prevent of lost parts during maintenance. In some implementations, the diameter of the through hole may be further designed to be slightly smaller than the diameter of the fastening unit so that the fastening unit is left in the receiving space.

Furthermore, the adjustable module 36 of the display device of this embodiment further comprises a pad 364 disposed on the adjustable unit 362. The pad 364 serves to buffer an impact force applied to the display device when being moved or placed and to increase the frictional force between the display device and placement surface (e.g., a table top), which helps to improve the overall display effect by reducing slippage of the display device. The pad 364 may further comprise a penetrating hole 3642 which is disposed correspondingly to the through hole 3622 of the adjustable unit 362. The penetrating hole 3642 in the pad 364 is designed to cooperate with the through hole 3622 of the adjustable unit 362 so that the fastening unit (not shown) can be disassembled through the penetrating hole 3642 and the through hole 3622 without the need of additionally disassembling the pad 364 during maintenance.

However, the pad may also have no penetrating hole in an implementation. For a pad that has no penetrating hole, although the fastening unit can be disassembled through the through hole only by firstly disassembling the pad, this pad can effectively isolate the external dust to achieve the dust-proof effect. Furthermore, the pad of such an implementation may also be used with a display device that has no receiving space. In detail, after the fastening unit is disassembled, an enclosed space defined by the pad and the through hole of the adjustable module can be used to receive the disassembled fastening unit.

Figure 5:
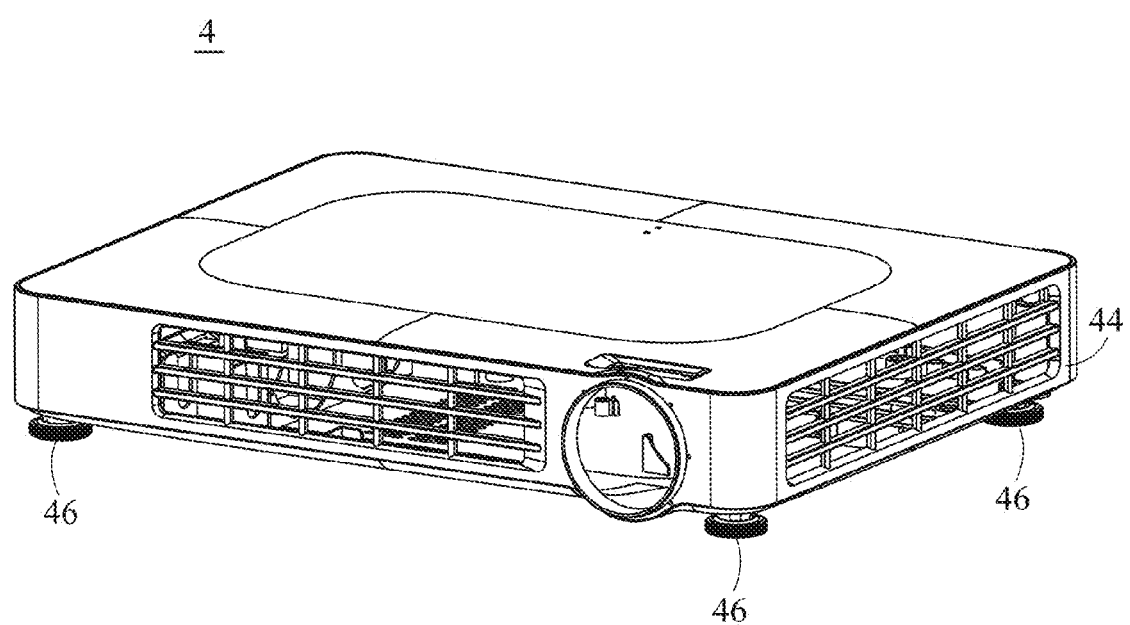
FIG. 5 is a schematic view illustrating the second embodiment of the display device of the present invention.

FIG. 5 illustrates a schematic view of the second embodiment of the display device of the present invention. Unlike the aforesaid embodiment, the display device 4 of the second embodiment has four adjustable modules 46 which are disposed at four right-angle corners of the lower case 44 respectively. In brief, as compared to the display device 2 of the first embodiment, the display device 4 of the second embodiment can adjust the display angle into a finer, more precise and more varied way. The other components and relationships among the components are similar to those of the first embodiment and, thus, will not be further described herein.

Figure 6:
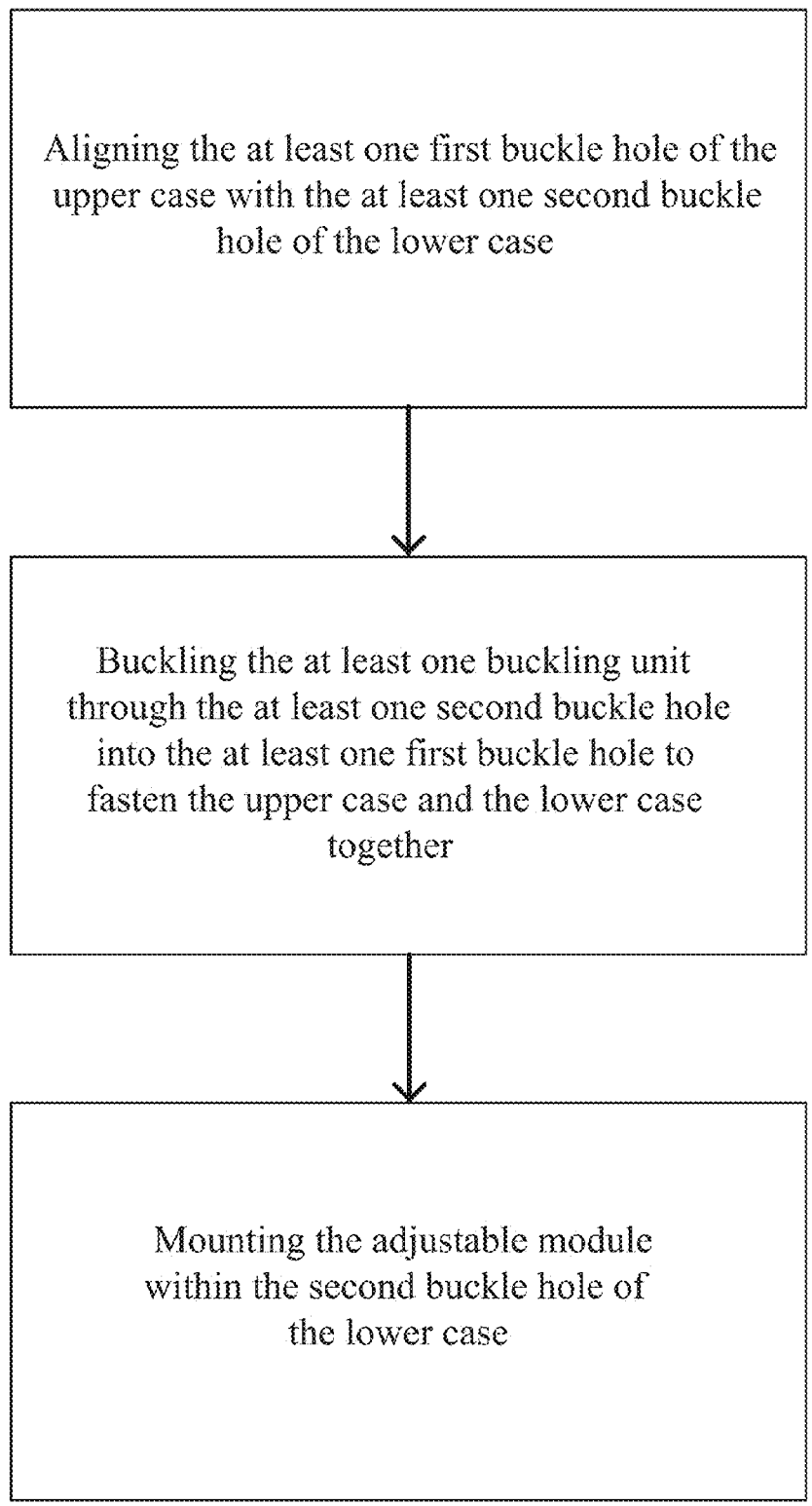
FIG. 6 is a flowchart diagram of an assembly method of a display device of the present invention.

Finally, with reference to FIG. 6, there is a flowchart diagram of an assembly method of a display device of the present invention. The display device may be the display device described in the first embodiment or the second embodiment.

First, at least one first fasten hole of an upper case is aligned with at least one second fasten hole of a lower case. In the case of the first embodiment, the two first fasten holes of the upper case are aligned with the two second fasten holes of the lower case. Then, at least one fastening unit is fastened through the second fasten hole into the first fasten hole to fasten the upper case and the lower case together. Finally, an adjustable module is mounted within the second fasten hole of the lower case. In other words, when the aforesaid display device is to be maintained, the upper case and the lower case can be separated simply by screwing the fastening unit out of the first fasten hole.

According to the above descriptions, the display device, the assembly method of the display device and the assembly structure for use in the display device of the present invention have an adjustable module and a fastening unit of the display device disposed into the same fasten holes, thus making effective use of the internal space of the display device, combining the adjustable module and the cases together and miniaturizing the display device. Furthermore, sharing the same fasten holes can also decrease the number of the holes in the manufacturing process, reduce the overall consumption of materials and simplify the steps of disassembling the cases of the display device and maintaining the display device, thereby providing a low-cost display device.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A display device, comprising:
   an upper case comprising at least one first fasten hole;
   a lower case comprising at least one second fasten hole, which coaxially communicates with the at least one first fasten hole;
   at least one fastening unit, fixed in the at least one first fasten hole through the at least one second fasten hole to fasten the upper case and the lower case together; and
   at least one adjustable module, comprising an adjustable unit with a through hole penetrating therethrough, wherein the adjustable unit defines a first portion and a second portion, the through hole extends through a center of the first portion and a center of the second portion, the first portion is exposed outside the lower case and the second portion is partially mounted inside the at least one second fasten hole.

2. The display device as claimed in claim 1, wherein the first portion of the adjustable unit is a screw nut and the second portion of the adjustable unit is a screw bolt.

3. The display device as claimed in claim 1, wherein the at least one adjustable module further comprises a pad disposed on the adjustable unit.

4. The display device as claimed in claim 3, wherein the pad further comprises a penetrating hole which is disposed corresponding to the through hole of the adjustable unit.

5. The display device as claimed in claim 1, wherein the adjustable unit and the fastening unit define a receiving space within the at least one second fasten hole.

6. The display device as claimed in claim 4, wherein the upper case and the lower case are rectangle cases, and the at least one first fasten hole and the at least one second fasten hole are respectively disposed at any one of the right-angle corners, which correspond to each other, of the upper case and the lower case.

7. The display device as claimed in claim 4, wherein the at least one first fasten hole and the at least one second fasten hole are two first fasten holes and two second fasten holes respectively, and the at least one adjustable module are two adjustable modules.

8. The display device as claimed in claim 4, wherein the at least one first fasten hole and the at least one second fasten hole are four first fasten holes and four second fasten holes respectively, and the at least one adjustable module are four adjustable modules.

9. The display device as claimed in claim 1, wherein the display device is a projection device.

10. An assemble method of a display device, wherein the display device comprises: an upper case comprising at least one first fasten hole; a lower case comprising at least one second fasten hole which coaxially communicates with the at least one first fasten hole; at least one fastening unit, fastening the upper case and the lower case together; and at least one adjustable module comprising an adjustable unit with a through hole penetrating therethrough, wherein the adjustable unit defines a first portion and a second portion, and the through hole extends through a center of the first portion and a center of the second portion; the assembly method comprising:

aligning the at least one first fasten hole of the upper case with the at least one second fasten hole of the lower case;

fastening the at least one fastening unit through the at least one second fasten hole into the at least one first fasten hole to fasten the upper case and the lower case together; and mounting the at least one adjustable module partially within the at least one second fasten hole of the lower case, wherein the first portion is exposed outside the lower case and the second portion is partially mounted inside the second fasten hole.

11. An assembly structure for use in a display device, wherein the display device comprises an upper case and a lower case assembled opposite to the upper case, the assembly structure comprising:

a first fasten hole, being disposed in the upper case;

a second fasten hole, being disposed in the lower case and coaxially communicating with the first fasten hole;

a fastening unit, fixed in the first fasten hole through the second fasten hole to fasten the upper case and the lower case together; and an adjustable module, comprising an adjustable unit with a through hole penetrating therethrough, wherein the adjustable unit defines a first portion and a second portion, the through hole extends through a center of the first portion and a center of the second portion, the first portion is exposed outside the lower case and the second portion is partially mounted inside the second fasten hole.

12. The assembly structure as claimed in claim 11, wherein the adjustable module further comprises a pad disposed on the adjustable unit.

13. The assembly structure as claimed in claim 12, wherein the pad further comprises a penetrating hole which is disposed corresponding to the through hole of the adjustable unit.

14. The assembly structure as claimed in claim 11, wherein the adjustable unit and the fastening unit define a receiving space within the at least one second fasten hole.

\* \* \* \* \*